United States Patent [19]
Kohno

[11] Patent Number: 5,471,073
[45] Date of Patent: Nov. 28, 1995

[54] FIELD EFFECT TRANSISTOR AND METHOD FOR PRODUCING THE FIELD EFFECT TRANSISTOR

[75] Inventor: Yasutaka Kohno, Itami, Japan

[73] Assignee: Mitsubishi Denki Kabushiki Kaisha, Tokyo, Japan

[21] Appl. No.: 114,369

[22] Filed: Sep. 1, 1993

[30] Foreign Application Priority Data

Jan. 29, 1993 [JP] Japan ........................ 5-13607

[51] Int. Cl.⁶ .................... H01L 29/48; H01L 21/265
[52] U.S. Cl. .................... 257/108; 257/254; 257/280; 257/284; 257/412; 257/473; 437/40; 437/44; 437/176; 437/203; 437/228; 437/235
[58] Field of Search ............... 257/108, 280, 257/284, 254, 412, 473; 437/40, 44, 176, 203, 228, 235

[56] References Cited

FOREIGN PATENT DOCUMENTS

| | | |
|---|---|---|
| 0178133 | 10/1985 | European Pat. Off. |
| 0183550 | 11/1985 | European Pat. Off. |
| 0353693 | 7/1989 | European Pat. Off. |
| 58-52881 | 3/1983 | Japan |
| 61-61465 | 3/1986 | Japan |
| 64-82632 | 3/1989 | Japan |
| 1204476 | 8/1989 | Japan |
| 2211638 | 8/1990 | Japan |
| 2027992 | 8/1979 | United Kingdom |

OTHER PUBLICATIONS

Zhao, "Modeling The Effects Of Surface States On DLTS Spectra of GaAs MESFET's", IEEE Transactions on Electron Devices, vol. 37, No. 5, May 1990, pp. 1235–1244.
Yeats et al., "Gate Slow Transients In GaAs MESFETs—Causes, Cures, And Impact On Circuits", IEEE pp. 842–845.
Takahashi et al., "Step-Recessed Gate Structure With An Undoped Surface Layer For Microwave And Millimeter-Weave High Power, High Efficiency GaAs MESFETs", IEICE Transactions, vol. E 74, No. 12, Dec. 1991, pp. 4141–4146.

Primary Examiner—Edward Wojciechowicz
Attorney, Agent, or Firm—Leydig, Voit & Mayer

[57] ABSTRACT

In a field effect transistor including a Schottky gate electrode disposed on an active region in a compound semiconductor substrate, a compressive stress of the gate electrode and a tensile stress of an insulating film serving as a passivation are concentrated on the lower edges of the gate electrode, whereby positive piezoelectric charges are produced in the compound semiconductor substrate in the vicinity of the gate electrode. The positive piezoelectric charges increase the effective donor concentration, reducing the thickness of the surface depletion layer. As the result, channel narrowing due to the surface depletion layer is suppressed.

13 Claims, 19 Drawing Sheets

FIELD EFFECT TRANSISTOR AND METHOD FOR PRODUCING THE FIELD EFFECT TRANSISTOR

FIELD OF THE INVENTION

The present invention relates to field effect transistors (hereinafter referred to as FETs) and, more particularly, to high-performance compound semiconductor field effect transistors that suppress delay in the pulse rise time of the drain current in response to a pulsed gate voltage. The invention also relates to methods for fabricating the field effect transistors.

BACKGROUND OF THE INVENTION

FIG. 19 is a sectional view illustrating a conventional planar FET. In the figure, reference numeral 1 designates a semi-insulating GaAs substrate with a (100) surface orientation. A gate electrode 3 comprising WSi is disposed on a part of the GaAs substrate 1. An n type GaAs active region 2 is disposed within the GaAs substrate 1 and lies at the surface where the gate electrode 3 is disposed. Relatively low impurity concentration n type GaAs regions 4 are disposed at opposite sides of the active region 2. Relatively high impurity concentration n type GaAs source and drain regions 5 are disposed at opposite sides of the relatively low impurity concentration regions 4. Source and drain electrodes 6 and 7 comprising AuGe/Ni/Au are disposed on the source and drain regions 5, respectively. A passivation film comprising SiON, SiO, SiN, or the like is disposed on the entire surface of the structure.

FIGS. 20(a)–20(e) illustrate a method for producing the planar FET of FIG. 19.

Initially, the n type GaAs active region 2 is formed in the semi-insulating GaAs substrate 1 by ion implantation (FIG. 20(a)). Then, WSi is deposited over the substrate by sputtering and a photoresist pattern is formed thereon. Using the photoresist pattern as a mask, the WSi film is etched by reactive ion etching, forming the WSi gate electrode 3 (FIG. 20(b)).

Using the WSi gate 3 as a mask, Si ions are implanted at energy of 50 KeV and dosage of $2 \times 10^{12}$ cm$^{-2}$ forming the relatively low ion concentration n type GaAs regions 4 (FIG. 20(c)).

Then, an SiO film is deposited over the entire surface of the wafer. The SiO film is anisotropically etched by reactive ion etching using a gas mixture of $CHF_3/O_2$, forming side walls 9 on opposite sides of the WSi gate 3.

Using the WSi gate 3 with the side walls 9 as a mask, Si ions are implanted at energy of 60 KeV and dosage of $3 \times 10^{13}$ cm$^{-2}$ followed by removal of the side walls 9 using BHF (buffered hydrofluoric acid) and annealing at 800° C. for 30 minutes, forming the relatively high ion concentration source and drain regions 5. If the insulating side walls 9 remain on the GaAs substrate during the annealing process, the side walls 9 unfavorably act on the GaAs substrate to produce Ga and As atom vacancies in the substrate and a current leakage layer at the interface between the side walls and the substrate, adversely affecting the FET characteristics. Therefore, the side walls 9 must be removed before the annealing process.

Thereafter, the source and drain electrodes 6 and 7 comprising AuGe/Ni/Au are formed by conventional deposition and lift-off techniques (FIG. 20(e)). Finally, an insulating film, such as SiN, SiON, or SiO, is deposited over the wafer to form the passivation film 21, completing the structure of FIG. 19.

FIG. 21 is a sectional view illustrating a conventional FET having a recessed gate structure. In the figure, reference numeral 1 designates a semi-insulating GaAs substrate having a (100) surface orientation. An n type GaAs active layer 15 having a recess is disposed on the GaAs substrate 1. A gate electrode 16 comprising Ti/Pt/Au is disposed in the recess. Source and drain electrodes 6 and 7 are disposed on the active layer 15 spaced apart from each other. An insulating film 24 is disposed on the whole surface of the structure.

A method for fabricating the FET of FIG. 21 is illustrated in FIGS. 22(a)–22(d).

Initially, as illustrated in FIG. 22(a), the n type GaAs active layer 15 is formed in the semi-insulating GaAs substrate 1 by ion implantation. Alternatively, the active layer may be epitaxially grown on the surface of the substrate by MBE (Molecular Beam Epitaxy) or MOCVD (Metalorganic Chemical Vapor Deposition). Then, the source and drain electrodes 6 and 7 comprising AuGe/Ni/Au are formed on the active layer 15 by conventional deposition and lift-off techniques (FIG. 22(b)).

Using a photoresist mask 23 with an opening opposite a region where a gate electrode is to be formed, the active layer 15 is etched with a mixture of tartaric acid and hydrogen peroxide to form a recess 15a (FIG. 22(c)).

Then, Ti/Pt/Au is deposited by sputtering using the photoresist mask 23. The photoresist mask 23 and overlying portions of the metal are removed by lift-off, forming the gate electrode 16 in the recess 15a. Finally, an insulating film, such as SiN, SiON, or SiO, is deposited over the entire surface of the wafer to form the passivation film 23, completing the structure of FIG. 21.

A description is given of transient response characteristics of a drain current when a pulse voltage is applied to the gate electrode of the above-described recessed-gate type GaAs FET. FIG. 23 schematically shows the transient response delay of the drain current in response to a pulsed gate voltage and FIG. 24 schematically shows the mechanism of the transient response delay.

As shown in FIG. 23, when a pulse voltage having a pulse width in a range from several μsec to several msec and an amplitude for turning on or off the channel is applied to the gate electrode of the conventional FET, although there is no delay in the drain current in responding to the gate voltage at the pulse decay time (channel OFF time), there is a delay in the drain current to the gate voltage at the pulse rise time (channel ON time). There are various arguments about this delay mechanism, but no definite explanation has been given yet. In "Modeling the Effects of Surface States on DLTS Spectra of GaAs MESFET's" (IEEE Transactions on Electron Devices, Vol.37, No.5, p.1235, 1990) and "Numerical Simulation of GaAs MESFET Gate-Lag with a Surface State Model" (Transactions of Electronic Information Communication Society, ED-91-142, p.25, 1992), variation in thickness of the surface depletion layer due to the capture and emission of electrons by the surface states on a region of the GaAs surface between the drain electrode and the gate electrode is thought to be an important factor of the delay mechanism. The delay mechanism will be described in more detail referring to FIG. 24. In FIG. 24, the drain voltage (Vds) is 5 V, the gate OFF voltage is −5 V, and the gate ON voltage is 0 V.

When the gate is in its ON state with the source-to-gate voltage of 0 V and the gate-to-drain voltage of −5 V, the surface states between the valence band and the Fermi level or the quasi Fermi level at the GaAs surface produced by this potential capture electrons. When −5 V is applied to the gate to turn off the gate, the quasi Fermi level at the surface approaches the conduction band and the surface states between the valence band and the quasi Fermi level increase, whereby the quantity of electrons captured by the surface states increases as compared with that in the ON state. The increase in the electrons captured by the surface states increases the positive electric charges, i.e., donors, within the substrate required to maintain electrical neutrality, resulting in an expanded surface depletion layer.

When 0 V is applied to the gate to turn on the gate, the quasi Fermi level at the surface approaches the valence band and the surface states between the conduction band and the quasi Fermi level emit electrons, whereby the quantity of electrons captured by the surface states decreases as compared with in the OFF state. The decrease in the electrons captured by the surface states decreases the positive electric charges, i.e., donors, within the substrate required to maintain electrical neutrality, resulting in a thin surface depletion layer.

As described above, the thickness of the surface depletion layer varies according to the electron capture and emission of the surface states. In case of the n type GaAs substrate, the time constant of the electron emission is much longer than that of the electron capture and, therefore, the reduction in the surface depletion layer at the gate ON time does not catch up with the reduction in the depletion layer beneath the gate electrode, resulting in the depletion layer between the ohmic electrode and the gate electrode being larger than the depletion layer beneath the gate electrode.

The drain current Id is qualitatively represented by the following formula:

$$Id \propto (R_{ch} + R_1(\tau) + R_2(\tau))^{-1}$$

where Rch is the intrinsic channel resistance, and $R_1(\tau)$ and $R_2(\tau)$ are resistances in regions narrowed by the surface depletion layers. It is understood from this formula that the channel narrowing due to the surface depletion layer reduces the drain Current and, particularly when the resistances $R_1(\tau)$ and $R_2(\tau)$ have time constants larger than the time constant of the intrinsic channel resistance $R_{ch}$ at the gate ON time, the pulse rise time of the drain current is delayed.

This phenomenon is seen in the conventional planar FET as shown in FIG. 25.

Since the delay in the pulse rise time of the drain current is caused by the channel narrowing due to the surface depletion layer, in order to reduce the delay, it is necessary to decrease the surface depletion layer or to make a structure in which channel narrowing due to the surface depletion layer hardly occurs.

As a structure for preventing channel narrowing, a two-stage recessed gate structure is disclosed in "Gate Slow Transients in GaAs MESFETs—Causes, Cures, AND Impact on Circuits", IEEE IEDM, p. 842, 1988, and a structure with an intrinsic type GaAs layer on a channel layer is disclosed in "Step-Recessed Gate Structure with an Undoped Surface Layer for Microwave and Milimeter-wave High Power, High Efficiency GaAs MESFETs" IEICE Transactions, Vol. E74, No. 12, 4141, 1991. However, these recessed-gate FETs are complicated in structure and production. In addition, no effective countermeasure to the delay in the drain current is reported with respect to the planar FET.

Since the thickness of the surface depletion layer is determined by the density of the GaAs surface states and the surface potentials pinned by the surface states, it is thought that the thickness of the surface depletion layer is reduced by reducing the density of the surface states and increasing the donor concentration of the substrate.

Although a surface treatment using ammonium sulfide or the like is proposed for reducing the density of the surface states, such a treatment adversely affects thermal stability in subsequent processing and has no definite effect on the delay in the drain current.

On the other hand, the increase in an donor concentration of the substrate to reduce the surface depletion layer has the following drawbacks. In the conventional recessed-gate FET, after forming the n type GaAs layer by ion implantation or epitaxial growth, the recess etching is carried out to attain a desired thickness of the active layer and then the gate electrode is formed in the recess. Therefore, the donor concentration in a region under the gate electrode is equivalent to the donor concentration in a region between the gate electrode and the source and drain electrodes as shown in FIG. 21. Since the donor concentration of the channel is determined by the intended use of the transistor, lower donor concentration causes larger delay in the pulse rise time of the drain current.

In the conventional planar FET, in order to suppress the short channel effect, the n type GaAs regions 4 having a donor concentration higher than that of the active region 2 are disposed between the active region and the relatively high donor concentration regions 5 as shown in FIG. 19. Since the donor concentration of the regions 4 is optimized for the short channel effect, the gate breakdown voltage, and the source resistance, it is impossible to increase the donor concentration of the regions 4 for the purpose of suppressing the delay in the pulse rise time of the drain current.

In the above-described conventional FETs, the variation in the thickness of the depletion layer created between the gate electrode and the ohmic electrodes does not catch up with the variation in the thickness of the depletion layer created under the gate electrode, resulting in a delay in the pulse rise time of the drain current.

SUMMARY OF THE INVENTION

It is an object of the present invention to provide a field effect transistor that effectively reduces the delay in the pulse rise time of the drain current to the pulse rise time of the gate voltage.

It is another object of the present invention to provide a method for fabricating the field effect transistor.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, in a planar FET, a stress is concentrated on each of opposite edges of the gate electrode to produce positive piezoelectric charges in the substrate in the vicinity of the edges of the gate electrode. The positive piezoelectric charges increase the effective donor concentration, reducing the thickness of the surface depletion layer.

According to a second aspect of the present invention, a recessed-gate FET includes insulating side walls disposed on opposite side surfaces of the recess. The side walls have stresses that produce positive piezoelectric charges in the substrate in the vicinity of the gate electrode. The positive piezoelectric charges increase the effective donor concentration, reducing the thickness of the surface depletion layer.

According to a third aspect of the present invention, a planar FET includes relatively high impurity concentration regions disposed at both sides of the active region, wherein the relatively high impurity concentration regions get nearer the gate electrode as the depth in the substrate thickness direction increases. Therefore, a depletion layer created in a region between the pinch-off point in the transistor OFF state and the relatively high impurity concentration region is controlled by the Schottky barrier beneath the gate electrode, suppressing channel narrowing due to the surface depletion layer. The relatively high impurity concentration regions are formed by oblique ion implantation using the gate electrode with side walls as a mask.

According to a fourth aspect of the present invention, the planar FET further includes relatively low impurity concentration regions disposed between the active region and the relatively high impurity concentration regions, wherein the relatively low impurity concentration regions are positioned beneath the gate electrode and increase with the depth in the substrate thickness direction. Therefore, channel narrowing due to the surface depletion layer is further suppressed. The relatively low impurity concentration regions are formed by oblique ion implantation using the gate electrode as a mask.

DETAILED DESCRIPTION OF THE PREFERRED EMBODIMENTS

Figure 1:
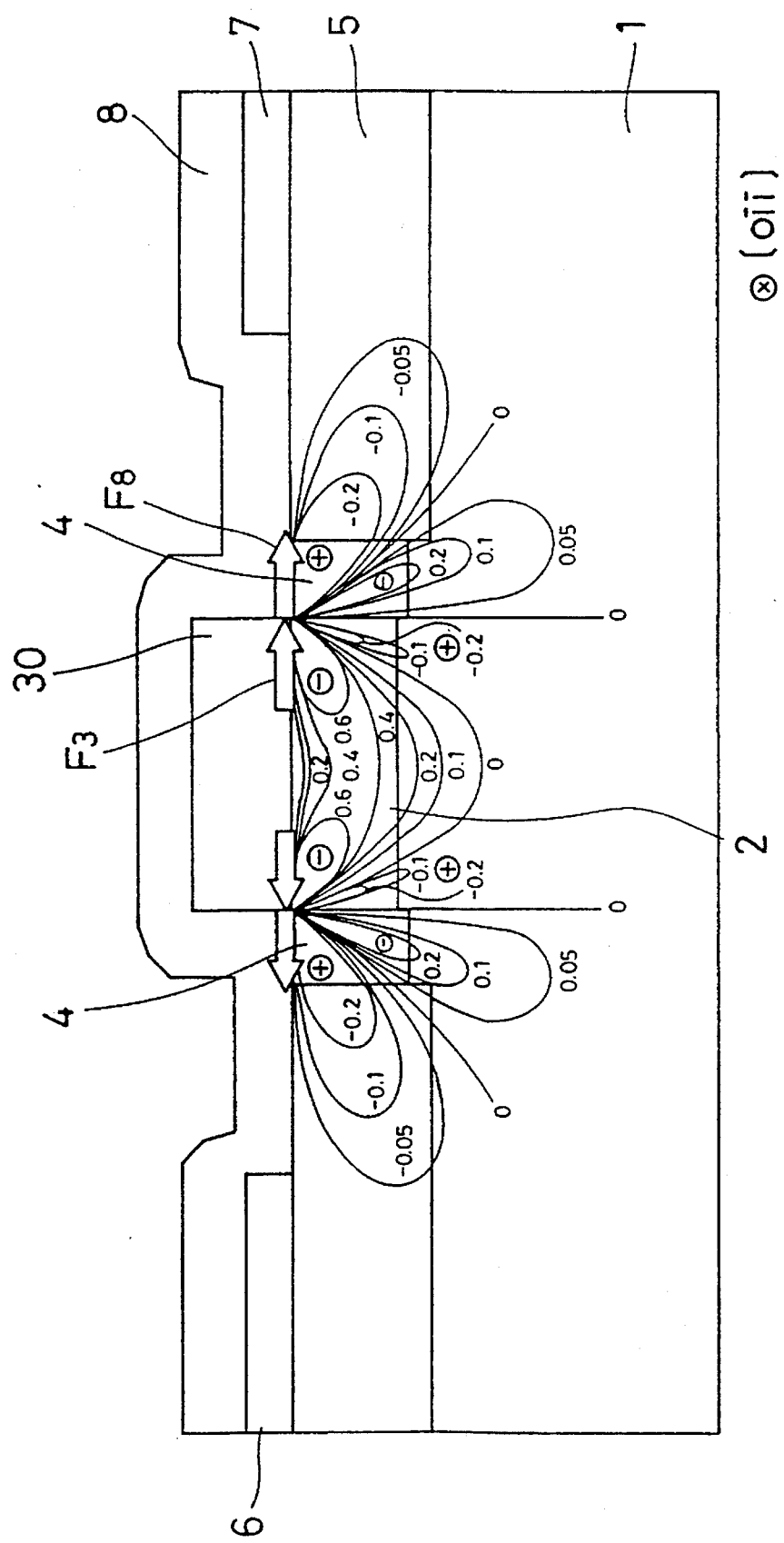
FIG. 1 is a sectional view illustrating a planar FET in accordance with a first embodiment of the present invention.
Figure 19:
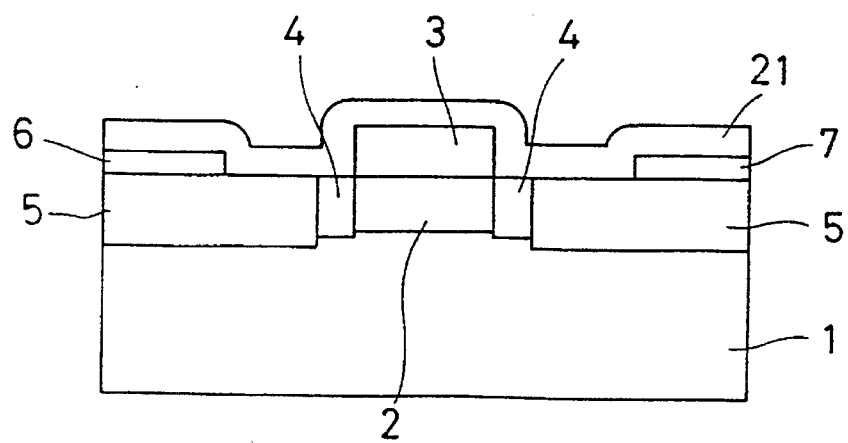
FIG. 19 is a sectional view illustrating a planar FET in accordance with the prior art.

FIG. 1 is a sectional view illustrating a planar FET in accordance with a first embodiment of the present invention. In FIG. 1, the same reference numerals as in FIG. 19 designate the same or corresponding parts. Reference numeral 30 designates a WSi gate electrode applying a compressive stress F3 to the (100) GaAs substrate 1. Reference numeral 8 designates an SiON film applying a tensile stress F8 to the (100) GaAs substrate 1.

Process steps for fabricating the FET of FIG. 1 are fundamentally identical to the conventional process steps shown in FIGS. 20(a) to 20(e) except that the sputtering conditions, such as the gas pressure and the gas applying power, for forming the WSi gate electrode 30 and the growth conditions of the SiON film 8 by plasma CVD are optimized to produce the compressive stress F3 and the tensile stress F8. More specifically, the gate electrode 30 with the compressive stress F3 to the substrate 1 is achieved by reducing the gas pressure during the sputtering. In the embodiments of the present invention described hereinbelow, the gate direction perpendicular to this paper is [0$\bar{1}$1], and the (011) surface is the cross-section plane.

When the compressive stress F3 of the WSi electrode 30 and the tensile stress F8 of the SiON film 8 are set as illustrated in FIG. 1, a large stress comprising the compressive stress F3 and the tensile stress F8 is applied to each of the opposite lower ends of the gate electrode 30 in the directions toward the ohmic electrodes 6 and 7. In this case, piezoelectric charges in a high concentration are produced in the vicinity of the edge of the gate electrode where the stress is applied, and positive piezoelectric charges are produced in the region at the side of the gate electrode 30. More specifically, when the synthetic stress, i.e., F3+F8, is $3 \times 10^5$ dyne/cm, positive piezoelectric charge having a density exceeding $5 \times 10^{17}$ cm$^{-3}$ are generated in the relatively low concentration n type GaAs region 4. This concentration of positive piezoelectric charges is approximately equal to the maximum donor density achieved by the ion implantation for forming the relatively low concentration regions 4 when Si ions are implanted at energy of 50 KeV and dosage of $2 \times 10^{12}$ cm$^{-2}$. In this case, the thickness of the surface depletion layer in the region 4 is about 70% of that in the case where the piezoelectric charges are absent. The reduction in the depletion layer thickness reduces the channel narrowing and shortens the pulse rise time of the drain current. Numerical values in FIG. 1 indicate normalized quantities of electric charges generated in the vicinity of the gate electrode 30, and the minus values indicate quantities of negative piezoelectric charges. In addition, the gate length is 1.0 μm, the gate thickness is 3000 Å, and the stress is $6 \times 10^9$ dyne/cm$^2$.

Figure 2:
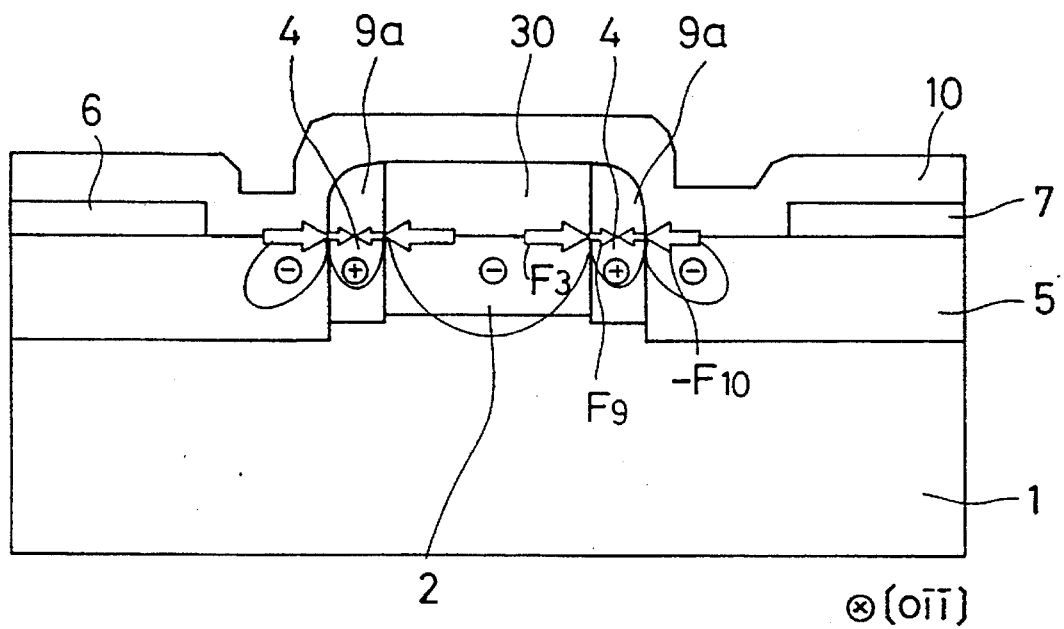
FIG. 2 is a sectional view illustrating a planar FET in accordance with a second embodiment of the present invention.

FIG. 2 is a sectional view illustrating a planar FET in accordance with a second embodiment of the present invention. In FIG. 2, the same reference numerals and characters as in FIG. 1 designate the same or corresponding elements. Reference numeral 9a designates SiO side walls each applying a tensile stress F9 to the substrate 1. Reference numeral 10 designates an SiON film serving as a passivation film and applying having a compressive stress F10 to the substrate 1.

A description is given of the production method.

The process steps up to the formation of the transistor are fundamentally identical to the conventional process steps illustrated in FIGS. 20(a) to 20(e) except that the gate electrode 30 is formed by sputtering under the above-described conditions to generate the compressive stress F3.

Figure 3:
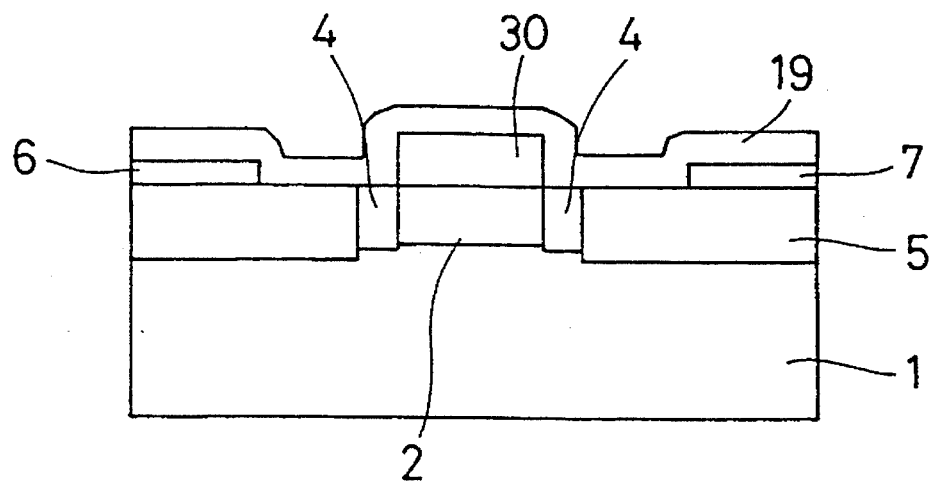
FIGS. 3(a) and 3(b) are sectional views illustrating a method for fabricating the planar FET of FIG. 2.
Figure 3:
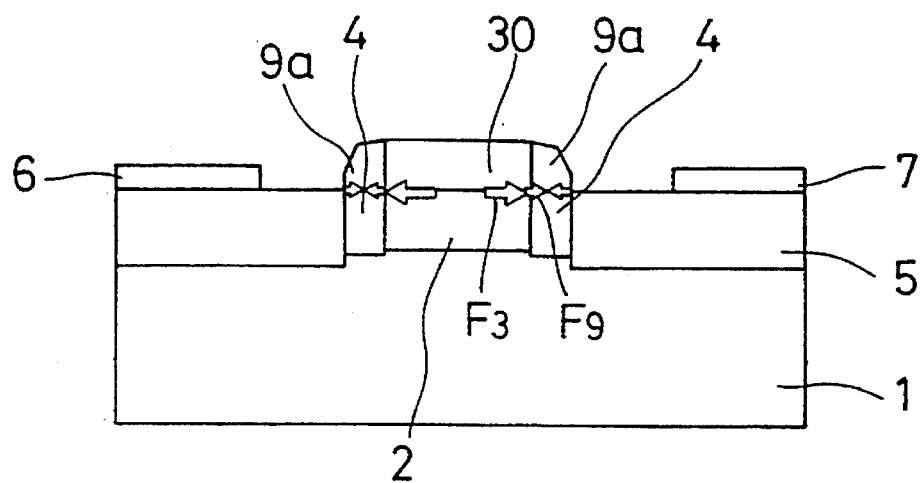
Figure 20:
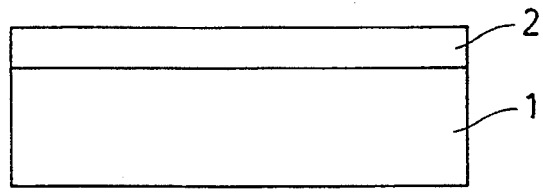
FIGS. 20(a) to 20(e) are sectional views illustrating a method for fabricating the planar FET of FIG. 19.
Figure 20:
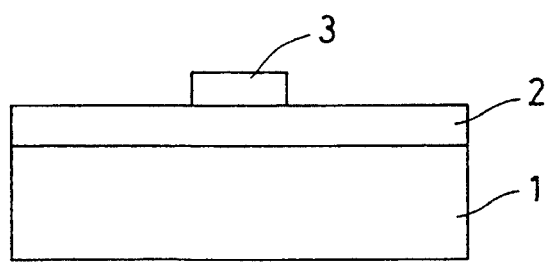
Figure 20:
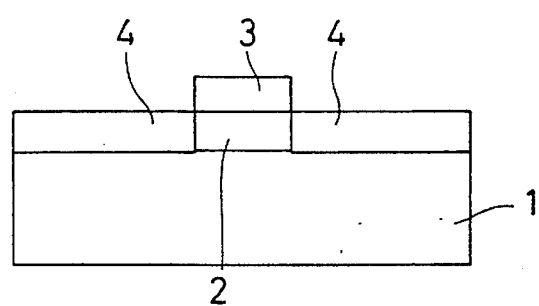
Figure 20:
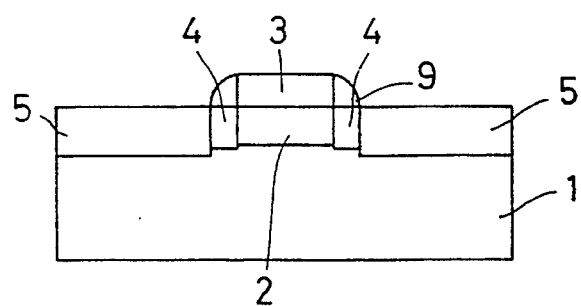
Figure 20:
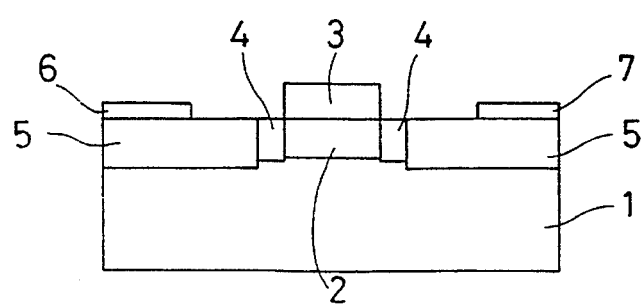

After completing the structure of FIG. 20(e), the SiO film 19 applying a tensile stress to the substrate 1 is formed on the entire surface of the wafer by plasma CVD (FIG. 3(a)). Then, the SiO film 19 is anisotropically etched by reactive ion etching using a gas mixture of CHF$_3$+O$_2$, forming the SiO side walls 9a having the tensile stress F9 on the opposite sides of the WSi gate electrode 30 (FIG. 3(b)). Finally, the SiON film 10 having a compressive stress is deposited over the structure to complete the FET of FIG. 2.

In the process step of FIG. 20(d), the SiO side walls 9 used as a mask for forming the low ion concentration n type GaAs regions 4 are removed because the subsequent annealing process at 800° C. reduces the stress of the side walls and causes the unfavorable reaction between the side walls and the GaAs substrate. In this second embodiment, after completing the transistor structure as shown in FIG. 20(e), the SiO side walls 9a are again formed as shown in FIGS. 3(a)–3(b).

In this second embodiment of the present invention, the concentration of piezoelectric charges produced in the GaAs substrate at each side of the WSi gate electrode 30 is equal to the sum of the concentration of the piezoelectric charges generated by a synthetic stress comprising the compressive stress F3 of the WSi gate electrode 30 and the tensile stress F9 of the side wall 9a, which stresses F3 and F9 concentrate at the lower edge of the gate electrode. A concentration of piezoelectric charges is produced by a synthetic stress comprising the tensile stress F9 of the side wall 9a and the compressive stress F10 of the SiON film 10, which stresses F9 and F10 concentrate at the interface between the side wall 9a and the SiON film 10. This piezoelectric charge concentration increases with a decrease in the spacing between the two stress concentrating points, i.e., the lower edge of the WSi gate electrode 3 and the interface between the side wall 9a and the SiON film 10. Since negative piezoelectric charges are produced in the GaAs substrate beneath the interface between the side wall 9a and the SiON film 10, which negative piezoelectric charges expand the surface depletion layer, the width of the side wall 9a is desired to be approximately equal to the width of the low ion concentration n type GaAs region 4. In this case, the negative piezoelectric charges are produced within the high ion concentration n type GaAs region 5 and do not adversely affect the surface depletion layer.

In this second embodiment, piezoelectric charges with a concentration twice as high as that of the first embodiment are produced if the stresses applied to the respective stress concentrating points are equal to each other, whereby the thickness of the surface depletion layer is reduced.

When the high concentration of positive piezoelectric charges is produced in the GaAs substrate at the side of the WSi gate electrode 30 as described in the first embodiment, negative piezoelectric charges are produced in the active layer 2 beneath the WSi gate electrode 30. These negative piezoelectric charges overlap with negative piezoelectric charges which are produced by the stress applied to the opposite edge of the gate electrode, producing a high concentration of negative piezoelectric charges in the active layer 2 which adversely affect the transistor characteristics, such as the pinch-off voltage, the mutual conductance, and the like. This phenomenon becomes more conspicuous as the gate length of the FET, i.e., the interval between the two stress concentrating points, becomes shorter. In this second embodiment, however, the negative piezoelectric charges produced in the active layer 2 beneath the WSi gate electrode 30 due to the stress applied to the end part of the WSi gate electrode 30 are canceled by positive piezoelectric charges produced in the active layer 2 due to the stress applied to the interface between the side wall 9a and the SiON film 10, reducing the influence on the transistor characteristics.

Figure 4:
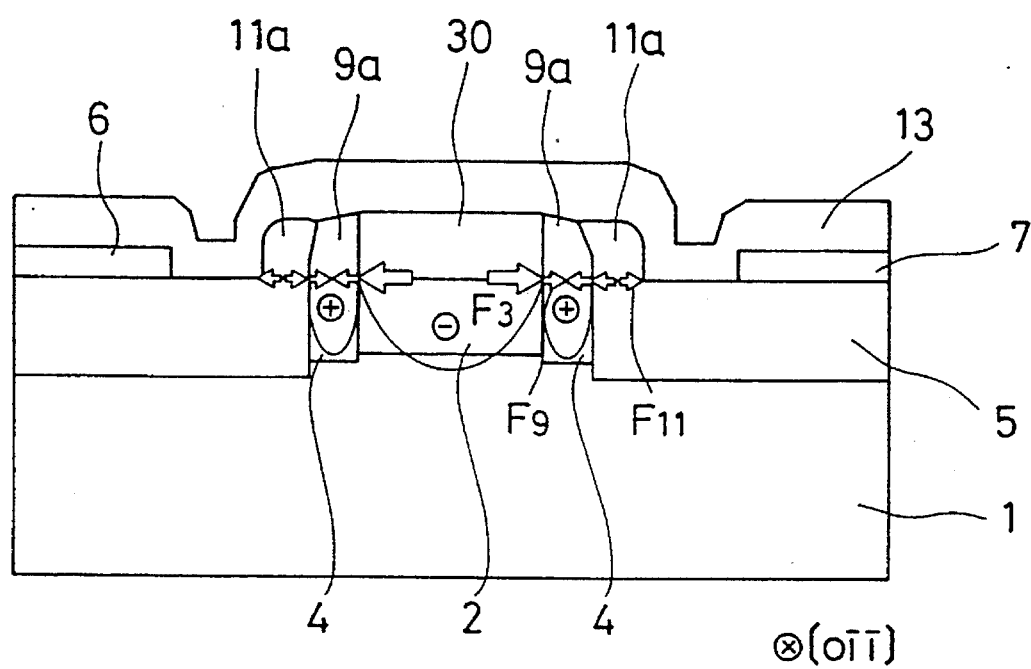
FIG. 4 is a sectional view illustrating a planar FET in accordance with a third embodiment of the present invention.

FIG. 4 is a sectional view illustrating a planar FET in accordance with a third embodiment of the present invention. In FIG. 4, the same reference numerals and characters as in FIG. 1 designate the same or corresponding elements. Reference numeral 11a designates SiN second side walls each having a compressive stress F11. Reference numeral 13 designates an SiON film having a compressive stress lower than $1 \times 10^{19}$ dyne/cm$^2$.

A description is given of the production method.

The process steps up to the formation of the side walls 9a are identical to the above-described process steps illustrated in FIGS. 20(a)–20(e) and 3(a)–3(b).

Figure 5:
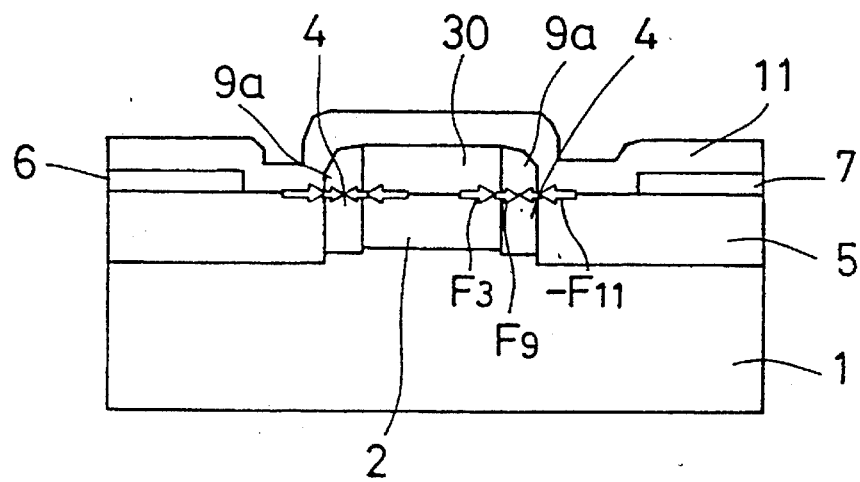
FIGS. 5(a) and 5(b) are sectional views illustrating a method for fabricating the planar FET of FIG. 4.
Figure 5:
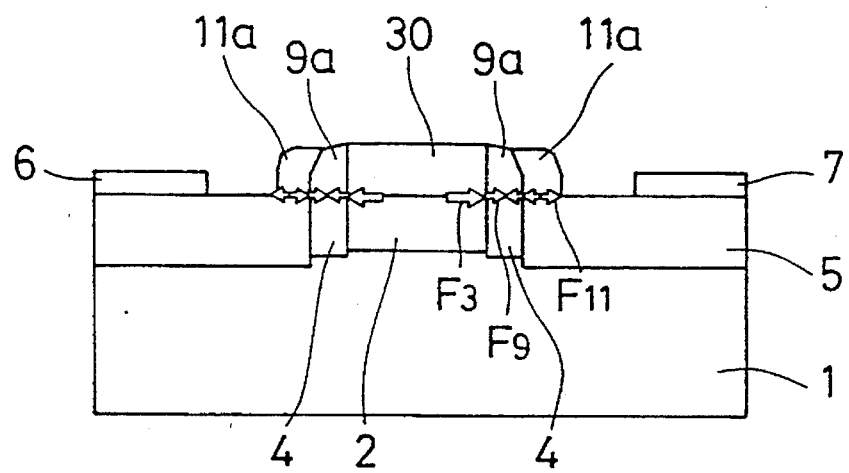

After forming the first side walls 9a on opposite sides of the WSi gate electrode 30, an SiN film 11 having a compressive stress is deposited over the wafer by plasma CVD (FIG. 5(a)). Then, the SiN film 11 is anisotropically etched by reactive ion etching using a gas mixture of CFH$_3$ and O$_2$ to form the second side walls 11a on opposite sides of the first side walls 9a. Finally, the SiON film with a compressive stress lower than $1 \times 10^{10}$ dyne/cm$^2$ is deposited over the structure, completing the FET of FIG. 4.

In this third embodiment, since the second side walls 11a each having the compressive stress F11 are adjacent to the first side walls 9a, the concentration of positive piezoelectric charges produced in the GaAs substrate at each side of the WSi gate electrode is equal to the sum of the concentration of positive piezoelectric charges produced by the synthetic stress comprising the compressive stress F3 of the WSi gate electrode 30 and the tensile stress F9 of the side wall 9a and the concentration of positive piezoelectric charges generated by the synthetic stress comprising the tensile stress F9 of the side wall 9a and the compressive stress F11 of the SiN film 11a. The stresses F9 and F11 concentrate at the interface between the first side wall 9a and the second side wall 11a. Therefore, piezoelectric charges with a concentration twice as high as that of the first embodiment are produced, reducing the thickness of the surface depletion layer. In addition, the negative piezoelectric charges produced in the active layer 2 beneath the WSi gate electrode 30 due to the stress applied to the edge of the WSi gate electrode 30 are canceled by positive piezoelectric charges produced in the active layer 2 due to the stress applied to the interface between the first side wall 9a and the second side wall 11a, reducing the influence of the negative piezoelectric charges in the active layer on the transistor characteristics.

When FETs according to the first and second embodiments are applied to MMICs or the like, the high stress films, i.e., the SiON films 8 and 10, will exfoliate or crack during the production process. In this third embodiment, however, since the low stress SiON film 13 is employed as the passivation film, the above-described problems are avoided.

In addition, since the low stress passivation film 13 having a compressive stress reduces the negative piezoelectric charges in the active layer beneath the gate electrode 30, the influence of the negative piezoelectric charges on the transistor characteristics is further reduced.

Figure 6:
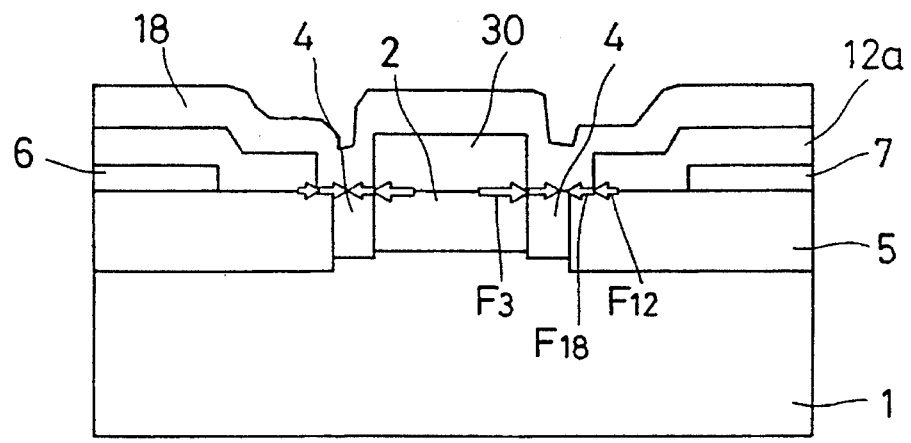
FIG. 6 is a sectional view illustrating a planar FET in accordance with a fourth embodiment of the present invention.

FIG. 6 is a sectional view illustrating a planar FET in accordance with a fourth embodiment of the present invention. In FIG. 6, the same reference numerals and characters as those in FIG. 1 designate the same or corresponding elements. Reference numeral 12a designates an SiN film having a compressive stress F12. Reference numeral 18 designates an SiON passivation film having a tensile stress F18. The SiON film 18 is partially in contact with the surface of the high concentration n type GaAs region 5.

A description is given of the production process.

The process steps up to the formation of the transistor are fundamentally identical to the conventional process steps illustrated in FIGS. 20(a) to 20(e) except for the condition in forming the gate electrode 30.

Figure 7:
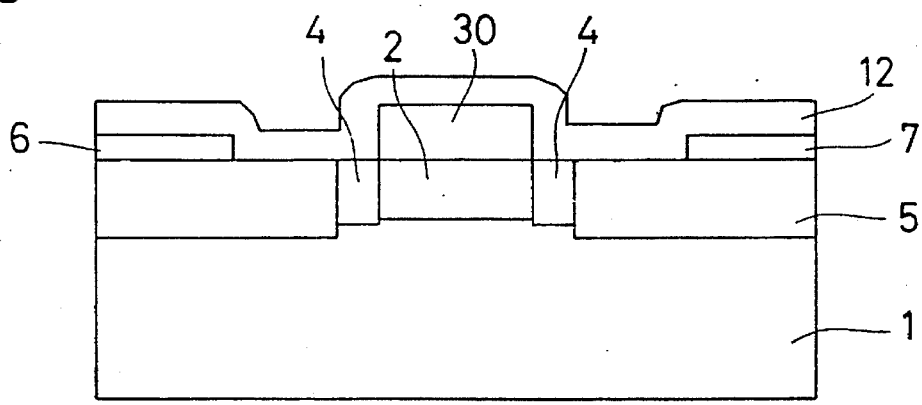
FIGS. 7(a) and 7(b) are sectional views illustrating a method for fabricating the planar FET of FIG. 6.
Figure 7:
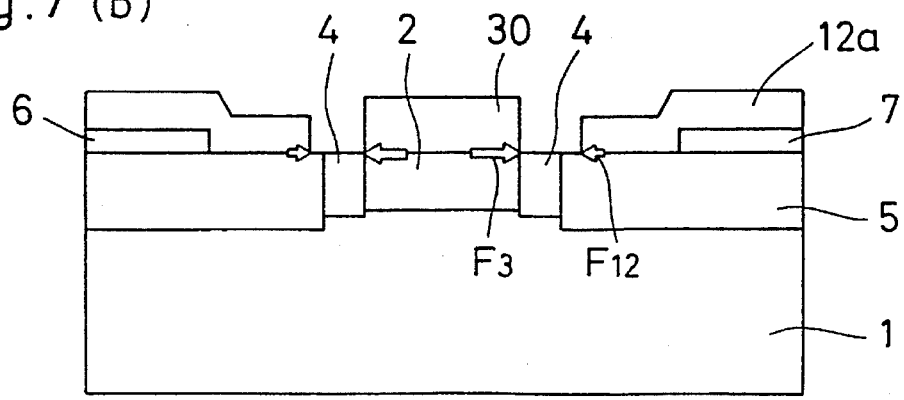

After completing the planar FET as shown in figure 20(e), the SiON film 12 having a compressive stress is deposited over the wafer by plasma CVD (FIG. 7(a)). Then, a photoresist (not shown) is deposited and patterned to open a portion opposite to the WSi gate electrode 30 and portions of the substrate at both sides of the gate electrode. Then, using the photoresist pattern as a mask, the SiN film 12 is anisotropically etched by a reactive ion etching using a gas mixture of $CHF_3$ and $O_2$. After the etching process, portions of the SiN film 12 remaining on opposite side surfaces of the WSi gate electrode 30 are removed by wet etching using BHF (buffer: hydrofluoric acid =30:1), followed by removal of the photoresist pattern, resulting in SiN films 12a on the high ion concentration n type GaAs regions 5.

During the wet etching, the etching rate of the SiN film 12 remaining on the opposite side surfaces of the gate electrode to the BHF is about ten times as high as that of the SiN film 12 remaining on the flat surface of the substrate, so that the SiN film 12 masked with the photoresist pattern is hardly etched by the wet etching. Finally, the SiON film 18 having a tensile stress F18 is deposited over the structure, completing the FET of FIG. 6.

According to the fourth embodiment of the present invention, the FET includes the gate electrode 30 having the compressive stress F3, the SiN films 12a having the compressive stress F12 disposed on regions except for the vicinity of the gate electrode 30, and the SiON film 18 having the tensile stress F18 disposed over the substrate including the vicinity of the gate electrode 30. Therefore, the concentration of positive piezoelectric charges produced in the GaAs substrate at each side of the WSi gate electrode 30 is equal to the sum of the concentration of positive piezoelectric charges produced by the synthetic stress comprising the compressive stress F3 of the WSi gate electrode 30 and the tensile stress F18 of the SiON film 18 and the concentration of positive piezoelectric charges generated by the synthetic stress comprising the tensile stress F18 of the SiON film 18 and the compressive stress F12 of the SiN film 12a, which stresses F18 and F12 concentrate at the interface between the SiON film 18 and the SiN film 12a. Therefore, piezoelectric charges with a concentration twice as high as that of the first embodiment are produced, reducing the surface depletion layer.

In addition, the negative piezoelectric charges produced in the active layer 2 beneath the WSi gate electrode 30 due to the stress applied to the end part of the WSi gate electrode 30 are canceled by positive piezoelectric charges produced in the active layer 2 due to the stress applied to the interface between the SiON film 18 and the SiN film 12a, reducing the influence of the negative piezoelectric charges in the active layer on the transistor characteristics.

Figure 8:
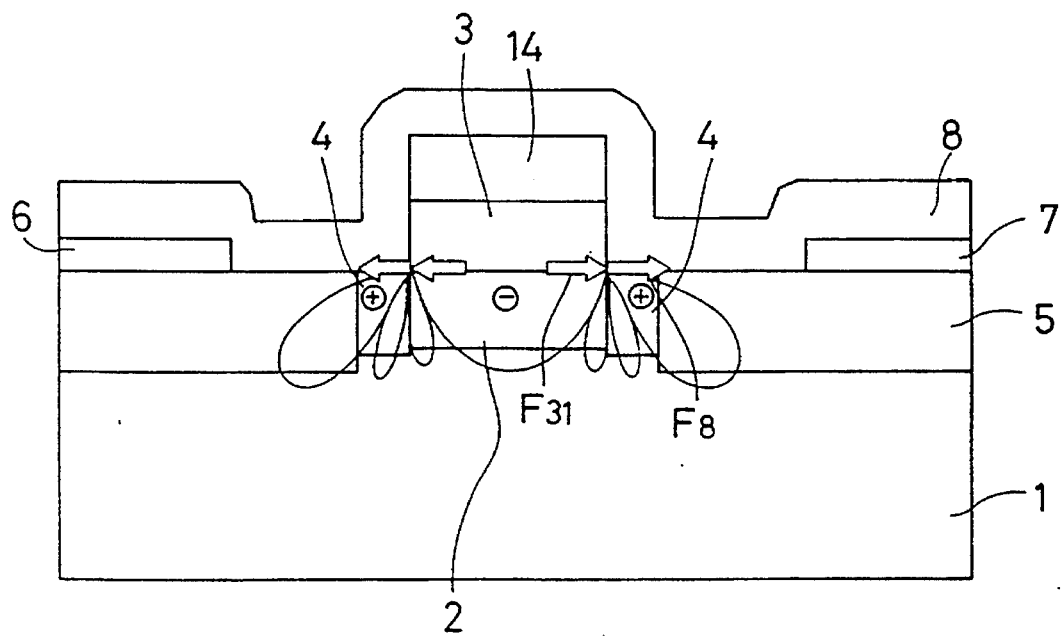
FIG. 8 is a sectional view illustrating a planar FET in accordance with a fifth embodiment of the present invention.

FIG. 8 is a cross-sectional view illustrating a planar FET in accordance with a fifth embodiment of the present invention. In FIG. 8, the same reference numerals and characters as in FIG. 1 designate the same or corresponding elements. Reference numeral 14 designates an SiO film having a compressive stress disposed on the WSi gate electrode 30. Reference character F31 designates a synthetic stress comprising the compressive stresses of the gate electrode 30 and the SiO film 14.

A description is given of the production process.

The process step of forming the active layer is identical to the conventional step shown in FIG. 20(a).

Figure 9:
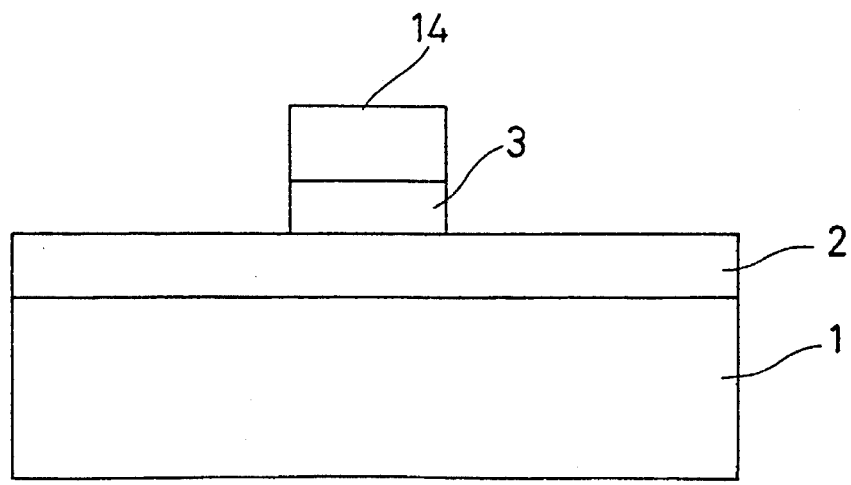
FIG. 9 is a sectional view illustrating a method for fabricating the planar FET of FIG. 8.

After forming the active layer 2, a WSi film is deposited over the whole surface of the active layer by sputtering and then an SiO film having a compressive stress is deposited thereon by plasma CVD. Then, a photoresist is patterned on the SiO film. Using the photoresist pattern as a mask, the SiO film is etched by reactive ion etching using a gas mixture of $CHF_3+O_2$ and the WSi film is etched by a reactive ion etching using a gas mixture of $SF_6$ and $CHF_3$, forming a two-layer structure comprising the WSi gate electrode 30 and the SiO film 14 (FIG. 9). Subsequent process steps to complete the structure of FIG. 8 are fundamentally identical to the conventional steps illustrated in FIGS. 20(c) to 20(e) except that the SiO film 14 is present on the WSi gate electrode 30.

According to the fifth embodiment of the present invention, the stress applied to the lower end of the WSi gate electrode 30 comprises the tensile stress F8 of the SiON film 8 and the synthetic stress F31 comprising the compressive stresses of the gate electrode 30 and the SiO film 14. In addition, since the stress F8 is approximately equal to the product of the stress S of the SiO film 8 and the thickness t of the SiON film 8 on the side surface of the gate electrode 30, i.e., F8=S×t, the stress F8 increases as compared with that of the first embodiment. Thus increased stress applied to the lower edges of the gate electrode 30 produces a higher concentration piezoelectric charges, resulting in a further reduction in the surface depletion layer.

Figure 10:
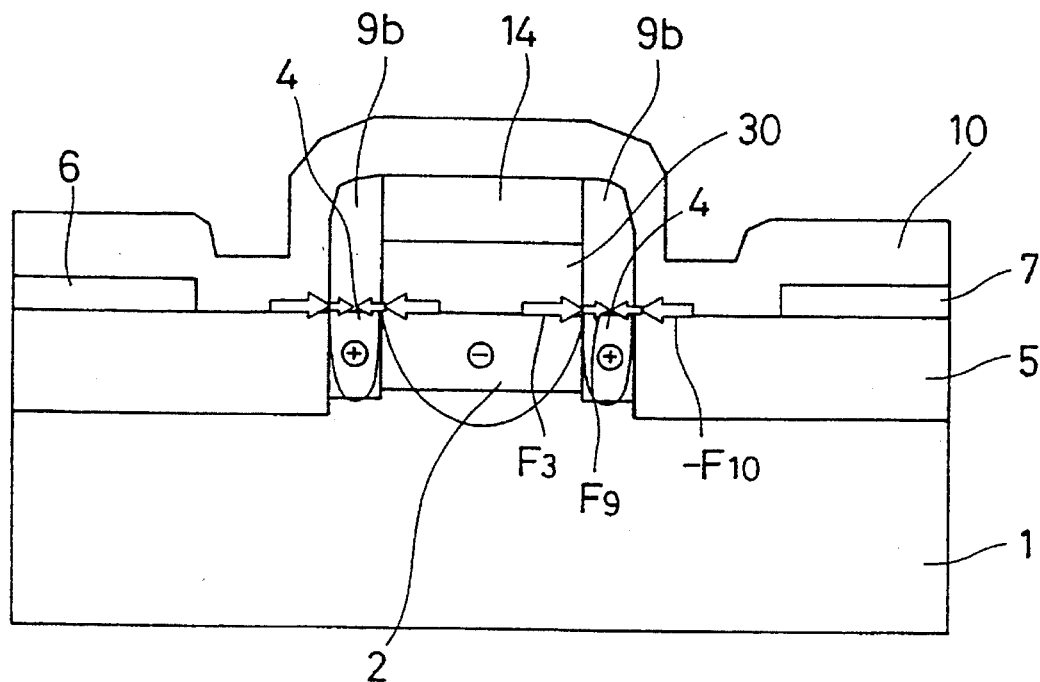
FIG. 10 is a sectional view illustrating a planar FET in accordance with a sixth embodiment of the present invention.

FIG. 10 is a sectional view illustrating a planar FET in accordance with a sixth embodiment of the present invention. In FIG. 10, the same reference numerals and characters as in FIG. 8 designate the same or corresponding elements.

Reference numeral 9b designates SiO side walls each having a tensile stress F9. Reference numeral 10 designates an SiON film having a compressive stress F10.

A description is given of the production process.

After forming the two-layer structure comprising the WSi gate 3 and the SiO film 14 on the active layer 2 as shown in FIG. 9, ion implantation is carried out according to the conventional process steps of FIGS. 20(c) and 20(d) to form the relatively low ion concentration n type GaAs regions 4 and the relatively high ion concentration n type GaAs regions 5.

Figure 11:
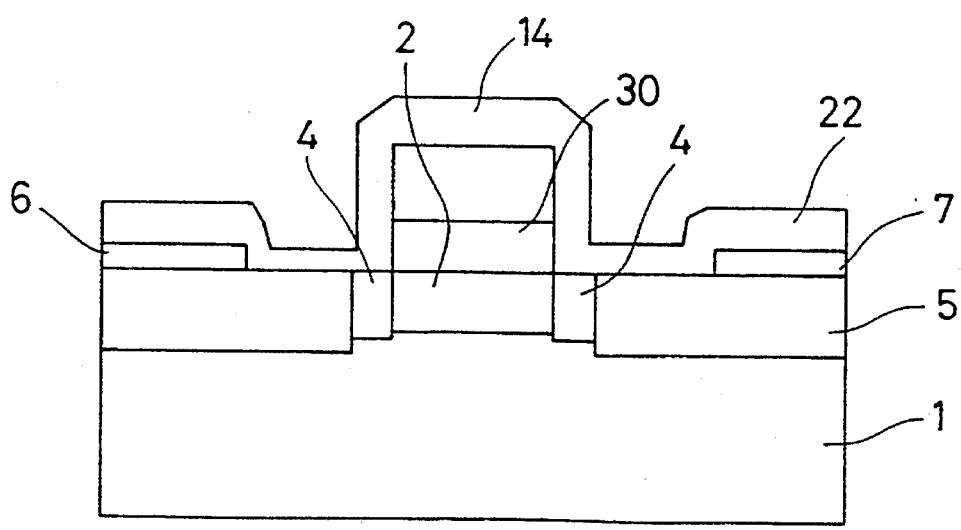
FIG. 11 is a sectional view illustrating a method for fabricating the planar FET of FIG. 10.

Then, as illustrated in FIG. 11, the SiO film 22 having a tensile stress is deposited over the entire surface of the substrate by plasma CVD method. Then, the SiO film 22 is anisotropically etched by reactive ion etching using a gas mixture of $CHF_3$ and $O_2$ to form side walls 9a on the opposite sides of the two-layer structure. Then, an SiON film 10 having a compressive stress F10 is deposited over the structure by plasma CVD to complete the FET of FIG. 10.

According to the sixth embodiment of the present invention, the stress applied to each of the opposite lower edges of the WSi gate electrode 30 comprises the synthetic stress F31 comprising the compressive stresses of the WSi gate electrode 30 and the SiO film 14, the tensile stress F9 of the SiO side wall 9b, and the compressive stress F10 of the SiON film 10. In this case, the stresses F9 and F10 are larger than those of the second embodiment for the reason described in the fifth embodiment, increasing the stress applied to the lower end of the gate electrode 30. Therefore, in this sixth embodiment, a still higher concentration of piezoelectric charges is produced, resulting in a still further reduction in the surface depletion layer.

Figure 12:
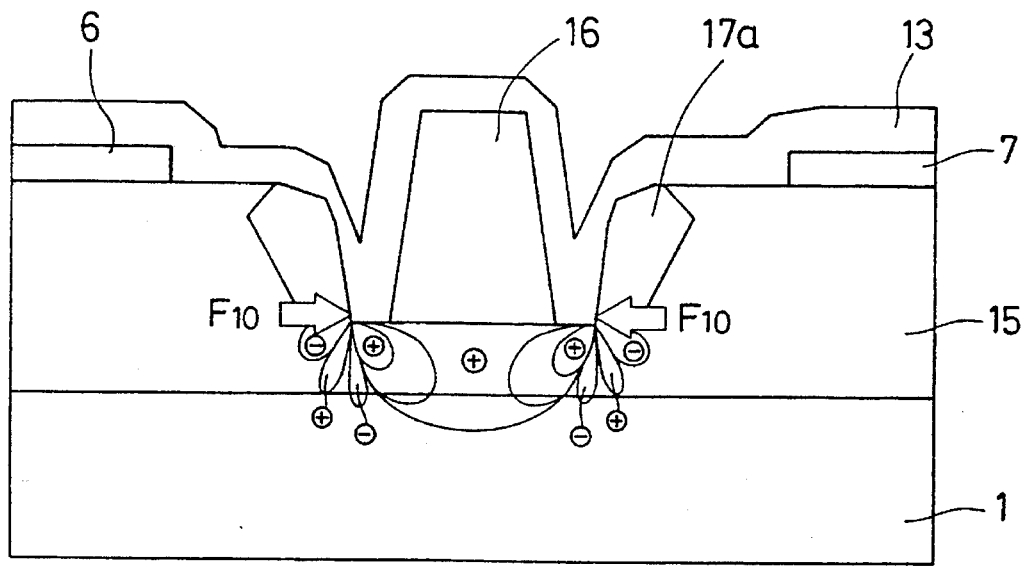
FIG. 12 is a sectional view illustrating a recessed-gate FET in accordance with a seventh embodiment of the present invention.
Figure 21:
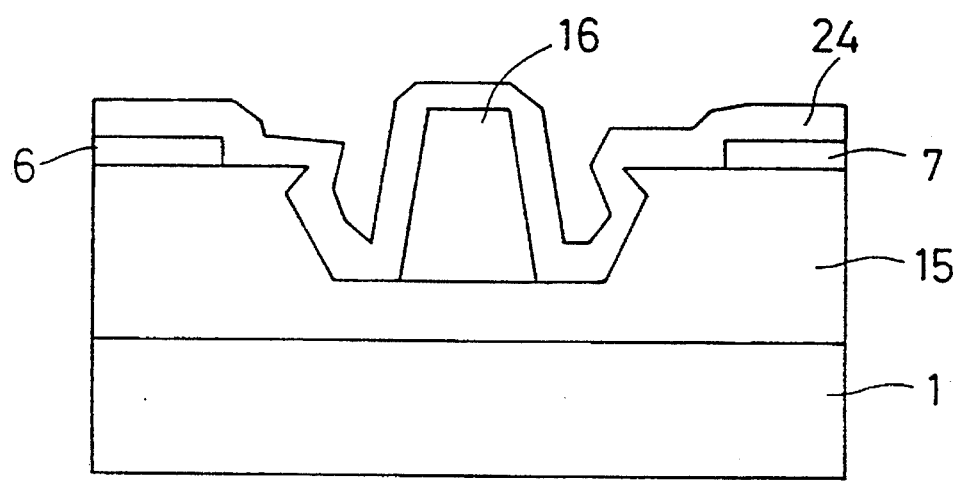
FIG. 21 is a sectional view illustrating a recessed gate FET in accordance with the prior art.

FIG. 12 is a sectional view illustrating a recessed-gate FET in accordance with a seventh embodiment of the present invention. In FIG. 12, the same reference numerals as in FIG. 21 designate the same or corresponding parts. Reference numeral 15 designates an n type GaAs layer having a recess. Reference numeral 17a designates SiON side walls each having a compressive stress, disposed on opposite inner surfaces of the recess. Reference numeral 13 designates an SiON film having a stress lower than $1\times10^{19}$ dyne/cm$^2$.

A description is given of the production process.

Figure 13:
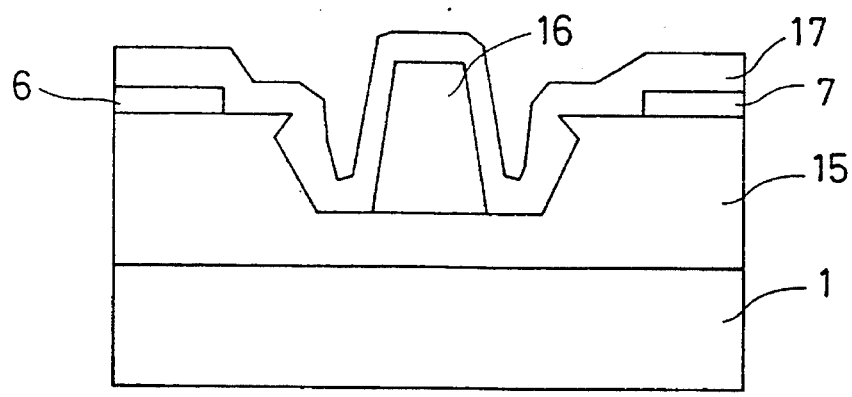
FIGS. 13(a) and 13(b) are sectional views illustrating a method for fabricating the recessed-gate FET of FIG. 12.
Figure 13:
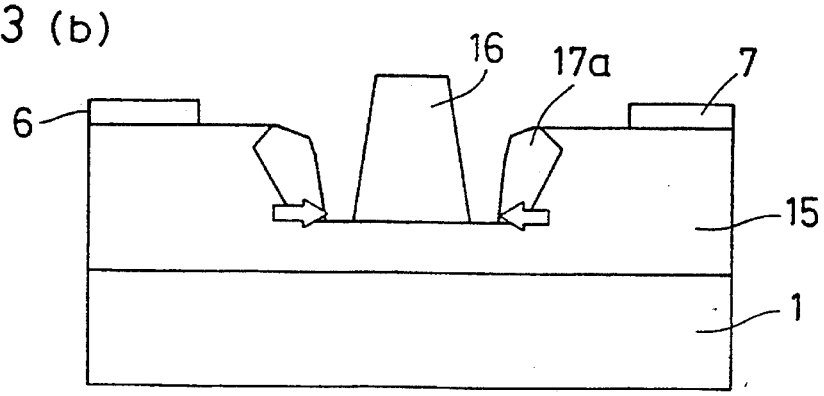

Process steps up to the step shown in FIG. 13(a) are identical to the conventional process steps illustrated in FIGS. 2(a) to 2(d).

Figure 22:
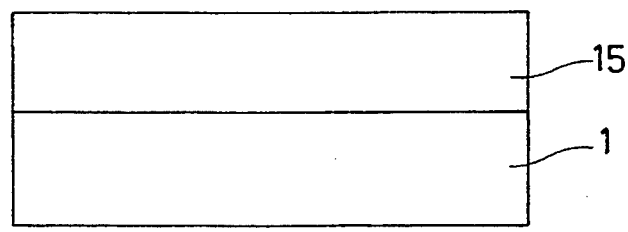
FIGS. 22(a) to 22(d) are sectional views illustrating a method for fabricating the FET of FIG. 21.
Figure 22:
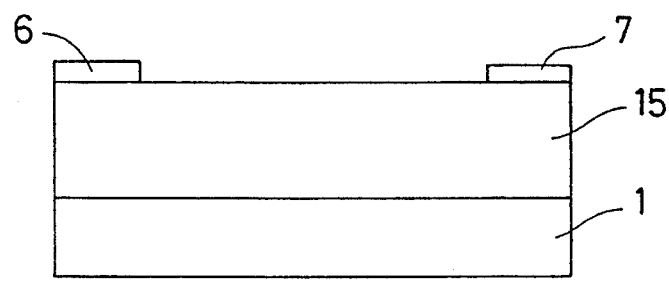
Figure 22:
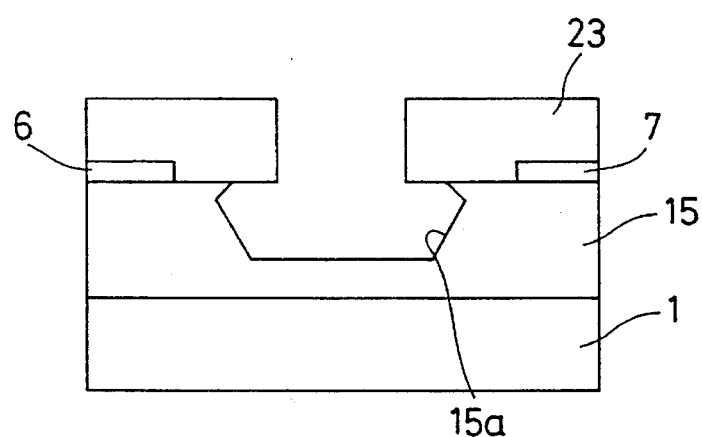
Figure 22:
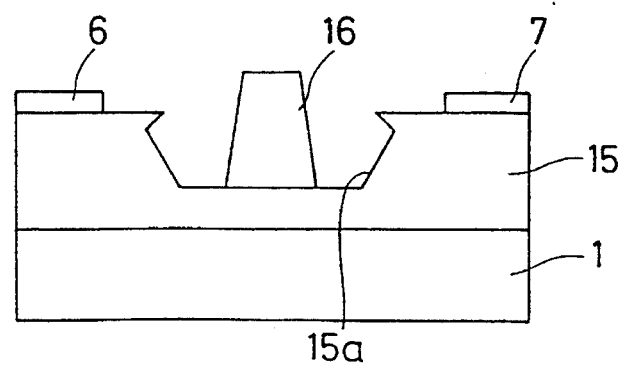
Figure 23:
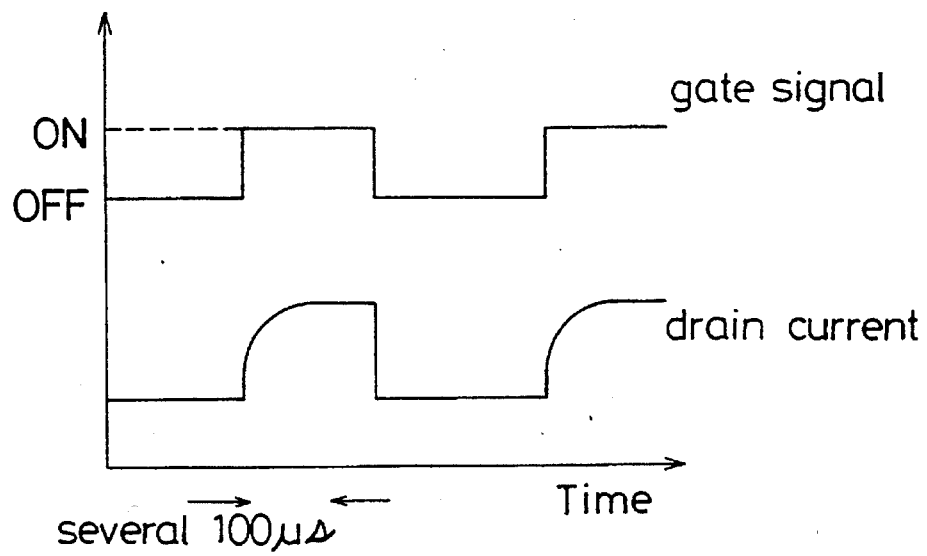
FIG. 23 is a schematic diagram illustrating waveshapes of a pulsed gate voltage and the resulting drain current.
Figure 24:
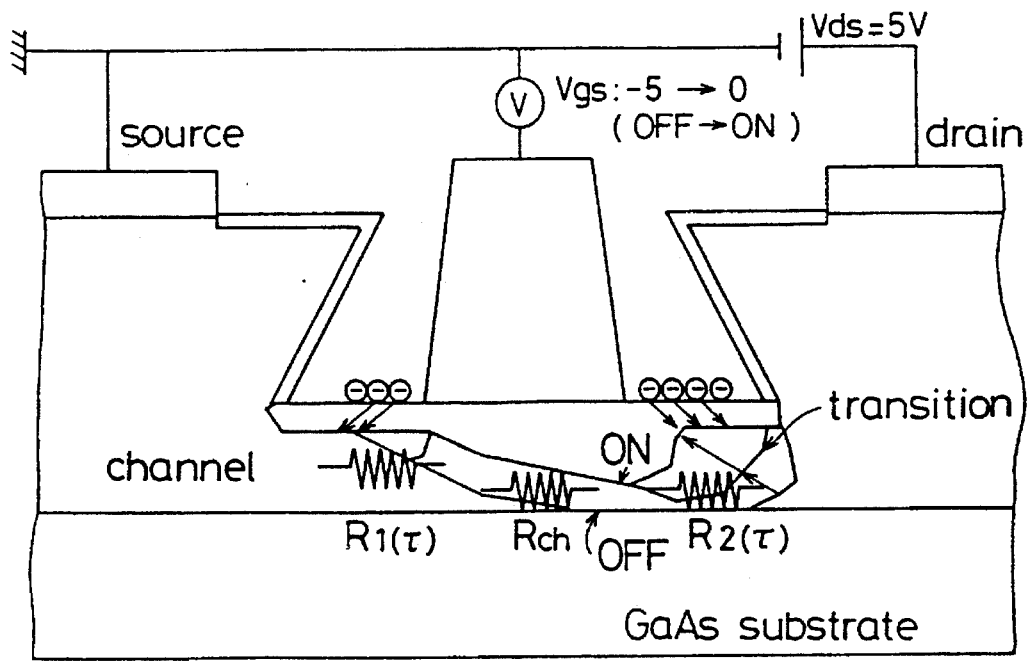
FIG. 24 is a schematic diagram for explaining the transient response delay of the drain current to the pulsed gate voltage in the prior art recessed gate FET.
Figure 25:
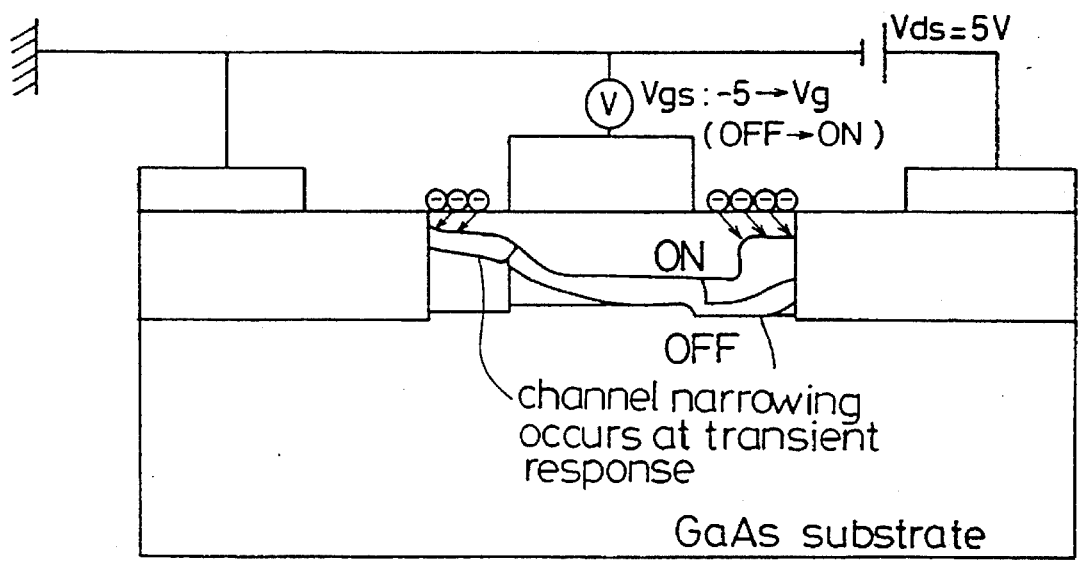
FIG. 25 is a schematic diagram for explaining the transient response delay of the drain current to the pulsed gate voltage in the prior art planar FET.

After completing the structure of FIG. 22(d), an SiON film 17 having a compressive stress is deposited by plasma CVD (FIG. 13(a)).

Then, the SiON film 17 is anisotropically etched by reactive ion etching using a gas mixture of $CHF_3$ and $O_2$, forming side walls 17a on opposite inner surfaces of the recess (FIG. 13(b)). Differently from the planar FET, no side wall is formed on opposite sides of the gate electrode 16 because the gate electrode 16 formed by deposition and lift-off techniques has a trapezoid shape. Finally, an SiON film 13 having a stress lower than $1\times10^{19}$ dyne/cm$^2$ is deposited over the entire surface by plasma CVD method, completing the structure of FIG. 12.

In this recessed-gate FET, since the side walls 17a each having a compressive stress are disposed on the opposite inner surfaces of the recess, positive piezoelectric charges are produced in the n type GaAs layer 15 in the vicinity of the opposite lower edges of the gate electrode 16 as shown in FIG. 12, reducing the thickness of the surface depletion layer.

Figure 14:
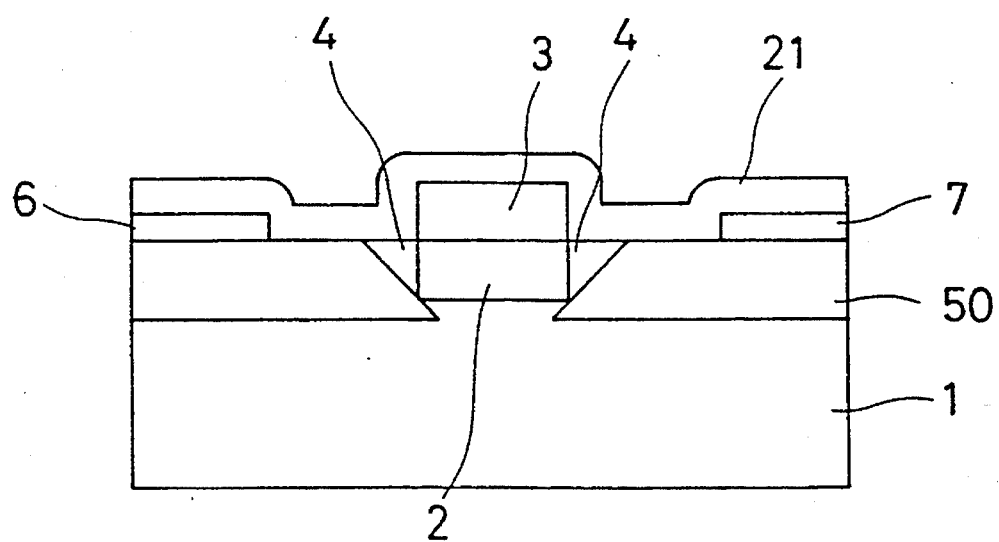
FIG. 14 is a sectional view illustrating a planar FET in accordance with an eighth embodiment of the present invention.

FIG. 14 is a sectional view illustrating a planar FET in accordance with an eighth embodiment of the present invention. In the above-described first to seventh embodiments, the high concentration positive piezoelectric charges are produced in the GaAs substrate in the vicinity of the opposite lower ends of the gate electrode to increase the effective donor concentration that reduces the surface depletion layer thickness. In this eighth embodiment, differently from the first to seventh embodiments, the depletion layer created in a region between the pinch-off point in the transistor OFF state and the high ion concentration n type GaAs region is controlled by the Schottky barrier to suppress the channel narrowing due to the surface depletion layer. That is, as illustrated in FIG. 14, the high concentration n type GaAs region 50 gets nearer to the gate electrode 3 as the depth of the region from the surface of the substrate increases.

FIGS. 15(a) to 15(g) illustrate process steps for fabricating the FET of FIG. 14.

Figure 15:
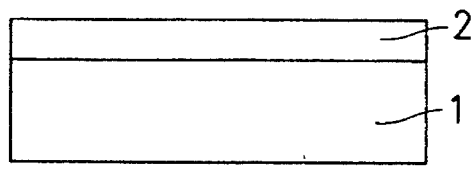
FIGS. 15(a) to 15(g) are sectional views illustrating a method for fabricating the planar FET of FIG. 14.
Figure 15:
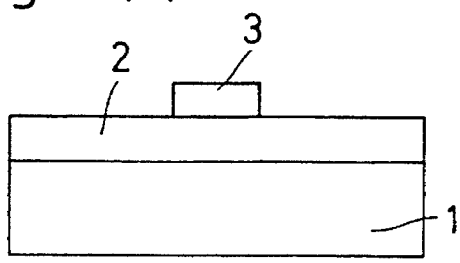
Figure 15:
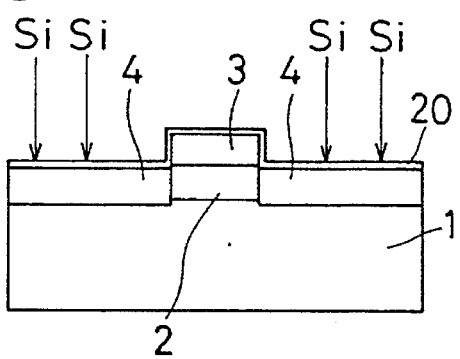
Figure 15:
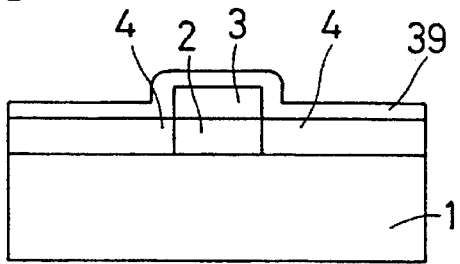
Figure 15:
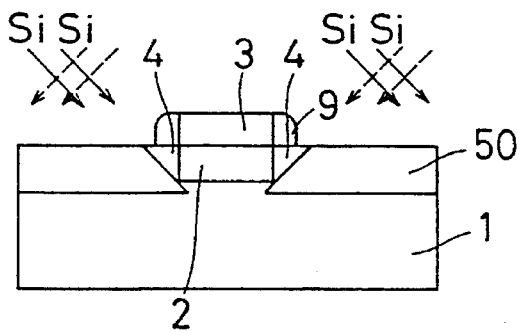
Figure 15:
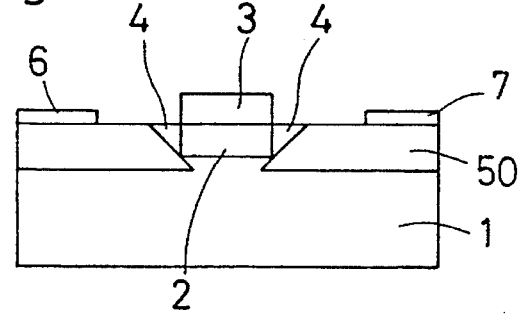
Figure 15:
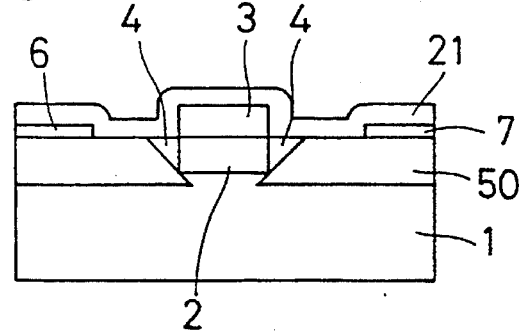

Initially, as illustrated in FIG. 15(a), an n type GaAs active region 2 is formed in a semi-insulating GaAs substrate 1 by ion implantation. Then, WSi is deposited over the substrate by sputtering and patterned by reactive ion etching using a photoresist pattern (not shown) as a mask to form the WSi gate electrode 3 (FIG. 15(b)).

Thereafter, an SiN film 20 about 200 Å thick is deposited to adjust the ion implanting point. Using the WSi gate electrode 3 as a mask, Si ions are implanted at energy of 50 KeV and dosage of $1\times10^{12}$ cm$^{-2}$ perpendicular to the surface of the substrate, forming the relatively low ion concentration n type GaAs regions 4 (FIG. 15(c)).

As illustrated in FIG. 15(d), an SiO film 39 is deposited over the substrate and then it is anisotropically etched by reactive ion etching using a gas mixture of $CHF_3$ and $O_2$, forming SiO side walls 9 on opposite sides of the WSi gate electrode 3.

Using the WSi gate electrode 3 with the side walls 9 as a mask, Si ions are implanted at energy of 60 KeV and dosage of $1.5\times10^{13}$ cm$^{-2}$ obliquely at an angle of 60° to the surface of the substrate, followed by removal of the side walls 9 using BHF and annealing at 800° C. for 30 minutes, forming the relatively high ion concentration n type GaAs regions 50. Since the side walls 9 unfavorably act on the GaAs substrate during the annealing at 800° C. and adversely affect the FET characteristics, the side walls 9 must be removed before the annealing process. Thereafter, Source and drain electrodes 6 and 7 comprising AuGe/Ni/Au are formed by conventional deposition and lift-off techniques (FIG. 15(f)).

Finally, an SiN film 21 serving as a passivation film is deposited over the structure, completing the planar GaAs FET shown in FIG. 15(g).

In this eighth embodiment, since the relatively high ion concentration n type GaAs regions 50 are formed by oblique ion implantation, the depletion layer created in a region between the pinch-off point and the n type GaAs region 50 is positioned beneath the Schottky barrier of the gate electrode 3 and influenced by the Schottky barrier, reducing channel narrowing due to the surface depletion layer.

Figure 16:
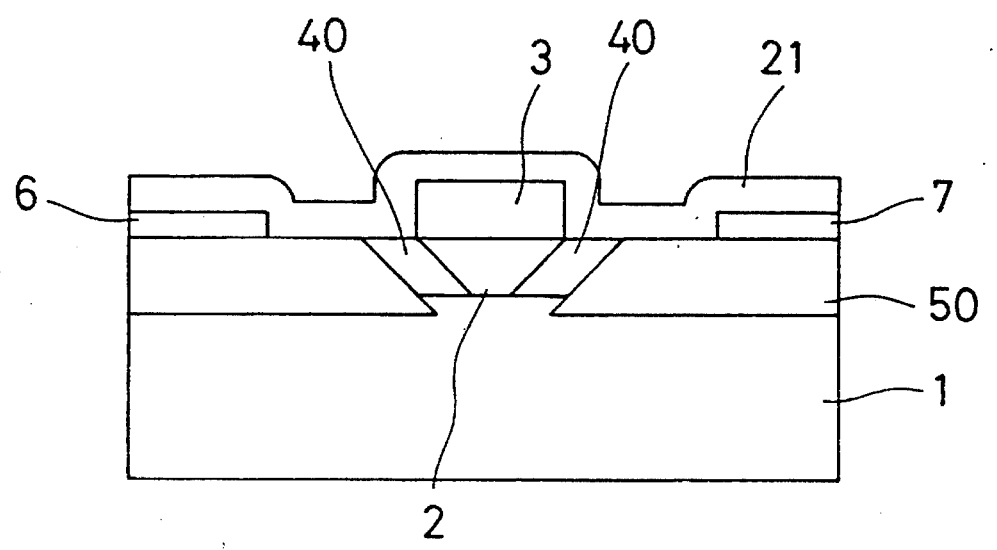
FIG. 16 is a sectional view illustrating a planar FET in accordance with a ninth embodiment of the present invention.

FIG. 16 is a sectional view illustrating a planar FET in accordance with a ninth embodiment of the present invention. In FIG. 16, the same reference numerals as in FIG. 14 designate the same or corresponding parts. In this ninth embodiment, the relatively low ion concentration n type GaAs regions 40 are formed by oblique ion implantation so that lower end portions thereof are positioned beneath the gate electrode 3.

A method for fabricating the FET of FIG. 16 is illustrated in FIGS. 17(a)–17(g).

Figure 17:
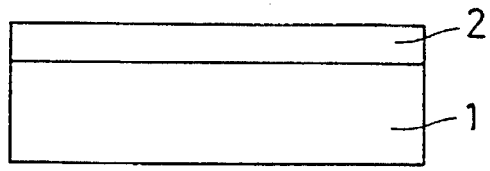
FIGS. 17(a) to 17(g) are sectional views illustrating a method for fabricating the planar FET of FIG. 16.
Figure 17:
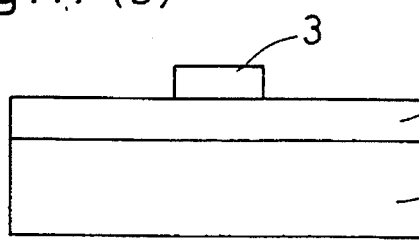
Figure 17:
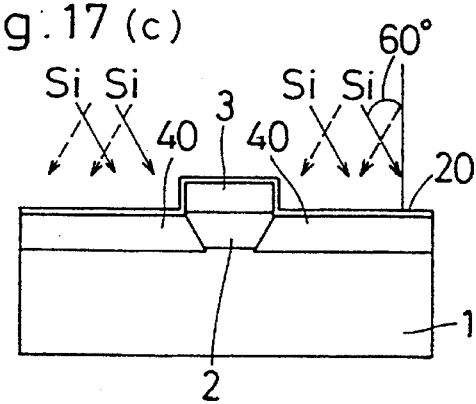
Figure 17:
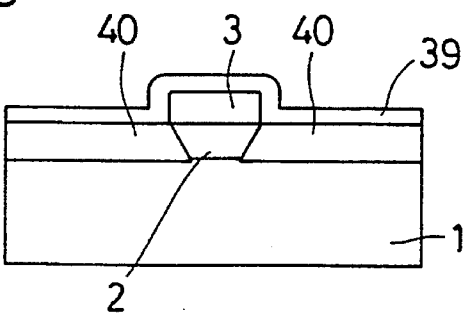
Figure 17:
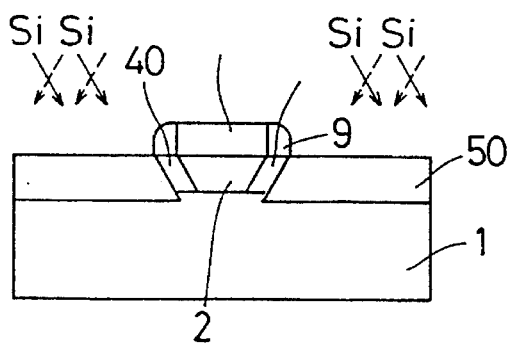
Figure 17:
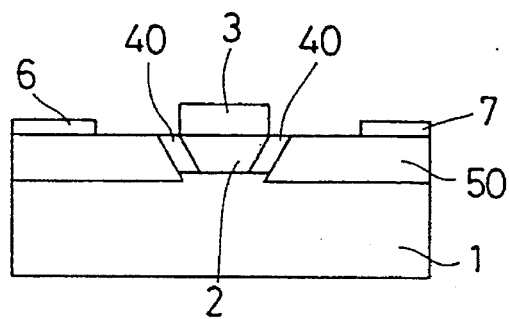
Figure 17:
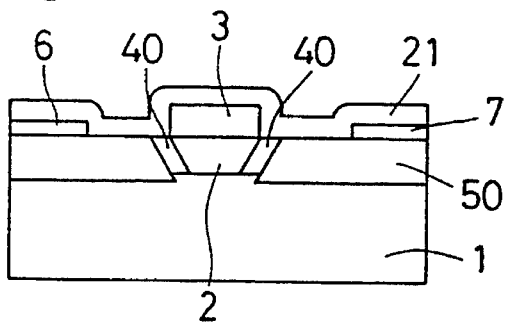

Process steps illustrated in FIGS. 17(a)–17(g) are fundamentally identical to the process steps illustrated in FIGS. 15(a)–15(g) except for the step of FIG. 17(c). In the step of FIG. 17(c), Si ions are implanted at an energy of 50 KeV and dosage of $1 \times 10^{12}$ cm$^{-2}$ obliquely at an angle of 60° to the surface of the substrate, forming the relatively low ion concentration n type GaAs regions 40, lower end portions of which are positioned beneath the gate electrode 3.

According to the ninth embodiment of the present invention, since both of the relatively low ion concentration regions 4 and the relatively high ion concentration regions 50 are formed by the oblique ion implantation, the pinch-off point between the source electrode 6 and the drain electrode 7 approaches the source electrode 6, whereby the reduction in the surface depletion layer at the gate ON time effectively follows the reduction in the depletion layer beneath the gate electrode.

Figure 18:
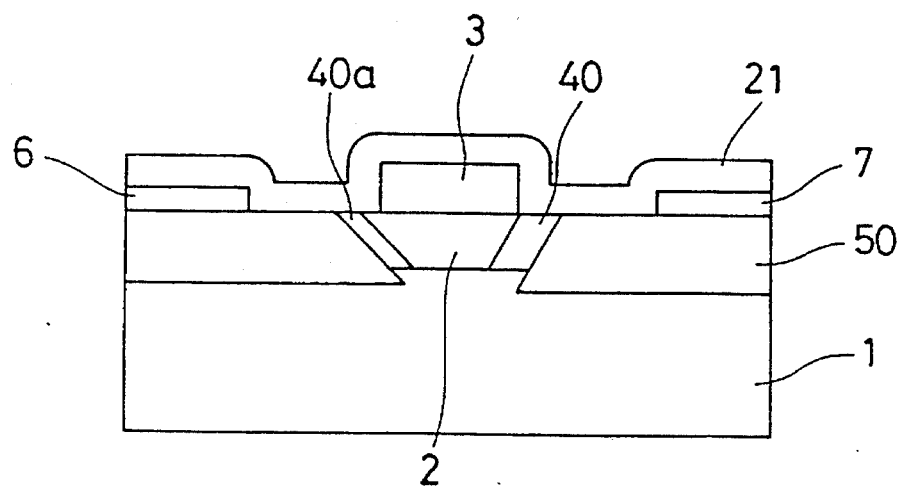
FIG. 18 is a sectional view illustrating a planar FET in accordance with a tenth embodiment of the present invention.

FIG. 18 is a cross-sectional view illustrating a planar FET in accordance with a tenth embodiment of the present invention. In FIG. 18, the same reference numerals as in FIG. 16 designate the same or corresponding parts. In the above-described ninth embodiment, channel narrowing is suppressed at both of the source side and the drain side. In this case, however, the portion of the low ion concentration region 4 positioned under the gate electrode at the source side increases the gate-to-source capacitance. Therefore, in this tenth embodiment, during the oblique ion implantation, the ion implanting angle and quantity from the source side are decreased to form the source side low ion concentration n type GaAs region 40a narrower than the drain side low ion concentration n type GaAs region 40, whereby the portion of the source side n type GaAs region 40a beneath the gate electrode 3 is reduced. Thereby, the source-to-drain capacitance is effectively reduced.

While in the above-described first to tenth embodiments the gate direction is [0$\overline{1}$1], the gate direction may be [0 $\overline{1}\overline{1}$]. In this case, the directions of the stresses described in these embodiments are reversed to change the compressive stresses to tensile stresses and the tensile stresses to compressive stresses, whereby the same effects as described above are achieved.

What is claimed is:

1. A field effect transistor including a compound semiconductor substrate having a surface, an active region in said substrate adjacent the surface, a Schottky gate electrode disposed on the surface at the active region, first side wall films disposed on and contacting opposite sides of said gate electrode, second side wall films disposed on and contacting opposite sides of respective first side wall films, and source and drain electrodes disposed on the surface spaced from and on opposite site sides of said gate electrode wherein positive piezoelectric charges are produced in said substrate proximate the surface between said gate electrode and said source and drain electrodes by a first stress comprising a first stress component within said gate electrode and a second stress component applied by said first side wall films, the first and second stress components acting in the same direction, and a second stress comprising a third stress component applied by said first side wall films and a fourth stress component applied by said second side wall films, the second stress acting in the direction opposite to the first stress.

2. The field effect transistor of claim 1 including a passivation film covering said gate electrode and said first and second side wall films and applying a stress smaller than the stresses applied by said first and second side wall films and acting in the same direction as the second stress.

3. A field effect transistor including a compound semiconductor substrate having a surface, an active region in said substrate adjacent the surface, a Schottky gate electrode disposed on the surface at the active region, source and drain electrodes disposed on the surface spaced from and on opposite sides of said gate electrode, an insulating film disposed on the surface except in the vicinity of said gate electrode, and an insulating passivation film disposed over said substrate in contact with the surface in the vicinity of said gate electrode, wherein positive piezoelectric charges are produced in said substrate proximate the surface between said gate electrode and said source and drain electrodes by a first stress comprising a first stress component within said gate electrode and a second stress component applied by said passivation film, the first and second stress components acting in the same direction, and a second stress comprising a third stress component applied by said passivation film and a fourth stress component applied by said insulating film, the second stress acting in a direction opposite to the first stress.

4. A field effect transistor including:

a compound semiconductor substrate;

an active layer disposed on said compound semiconductor substrate, said active layer having a recess with opposed side surfaces;

a Schottky gate electrode disposed in the recess on said active layer;

a source electrode and a drain electrode disposed on opposite sides of and spaced from said gate electrode on said active layer; and insulating side walls disposed on the opposed side surfaces of the recess, each side wall applying a stress that produces positive piezoelectric charges in said active layer in the vicinity of edges of said gate electrode.

5. A field effect transistor including a compound semiconductor substrate having a surface, an active region in said substrate adjacent the surface, a Schottky gate electrode disposed on the surface at the active region, and relatively high dopant impurity concentration regions in said substrate at opposite sides of the active region, wherein parts of the relatively high dopant impurity concentration regions are spaced from the surface of said substrate, the spacing from the surface of said substrate to said relatively high dopant impurity concentrations regions gradually increasing as said relatively high dopant impurity concentration regions approach said gate electrode.

6. The field effect transistor of claim 5 including relatively low dopant impurity concentration regions respectively disposed between said active region and said relatively high dopant impurity concentration regions, wherein portions of said relatively low dopant impurity concentration regions are positioned beneath said gate electrode.

7. The field effect transistor of claim 6 wherein said relatively low dopant impurity concentration region between said source electrode and said gate electrode beneath said gate electrode has a lower dopant impurity concentration than said relatively low dopant impurity concentration region between said drain electrode and said gate electrode.

8. A method of fabricating a field effect transistor including:

forming an active region within and at a surface of a compound semiconductor substrate;

forming a gate electrode comprising a refractory metal on the surface at the active region by sputtering while controlling sputtering conditions so that said gate electrode has a stress in a prescribed direction that produces positive piezoelectric charges in said substrate in the vicinity of said gate electrode;

forming insulating films on portions of said substrate but not in the vicinity of said gate electrode while controlling the conditions of forming said insulating films so that said insulating films apply stresses to said substrate that produce positive piezoelectric charges in said substrate proximate the surface in the vicinity of said gate electrode; and forming a passivation film over said substrate while controlling the conditions of forming said passivation film so that said passivation film applies a stress that produces positive piezoelectric charges in said substrate proximate the surface in the vicinity of said gate electrode.

9. A method of fabricating a field effect transistor including:

forming an active region within and at a surface of a compound semiconductor substrate;

forming a gate electrode comprising a refractory metal on the surface at the active region by sputtering while controlling sputtering conditions so that said gate electrode has a stress in a prescribed direction that produces positive piezoelectric charges in said substrate in the vicinity of said gate electrode;

implanting dopant impurity ions into said substrate using said gate electrode as a mask to form relatively low dopant impurity ion concentration regions in said substrate;

forming insulating masking side wall films on opposite sides of and contacting said gate electrode;

implanting dopant impurity ions into said substrate using said gate electrode and said masking side wall films as a mask to form relatively high dopant impurity ion concentration regions in said substrate;

removing said masking side wall films and activating the dopant impurity ion implanted regions by annealing;

forming first insulating side wall films on and contacting opposite sides of said gate electrode while controlling the conditions of forming said first insulating side wall films so that said first insulating side wall films apply stresses that produce positive piezoelectric charges in said substrate proximate the surface at opposite sides of said gate electrode;

forming second insulating side wall films on opposite sides of and contacting said first insulating side wall films while controlling the conditions of forming said second insulating side wall films so that said second side wall films apply stresses in prescribed directions that produce positive piezoelectric charges in said substrate proximate the surface at opposite sides of said gate electrode; and forming a passivation film over said substrate while controlling the conditions of forming said passivation film so that said passivation film applies a stress that produces positive piezoelectric charges in said substrate proximate the surface in the vicinity of said gate electrode.

10. A method of fabricating a field effect transistor including:

forming a recess in an active layer at a surface of and in a compound semiconductor substrate;

forming a gate electrode in the recess; and forming insulating side walls on the opposed side surfaces of the recess while controlling the conditions of forming said side walls so that said side walls apply stresses that produce positive piezoelectric charges in said substrate in the vicinity of said gate electrode.

11. A method of fabricating a field effect transistor including:

forming an active region within and at a surface of a compound semiconductor substrate;

forming a gate electrode on the surface at the active region;

forming side walls on opposite sides of and contacting said gate electrode; and implanting dopant impurity ions into said substrate obliquely to the surface of said substrate using said gate electrode and said side walls as a mask to form doped region in said substrate at both sides of said gate electrode, wherein portions of said doped regions have varying spacing from the surface and wherein the spacing of the doped regions from the surface gradually increases as the doped regions approach said gate electrode.

12. The method of claim 11 including, before forming said sides walls, implanting dopant impurity ions into the substrate obliquely to the surface of said substrate using said gate electrode as a mask to form relatively low dopant impurity concentration regions at both sides of said gate electrode, wherein portions of said relatively low dopant impurity concentration regions are positioned beneath said gate electrode.

13. The method of claim 12 wherein the ion implantation forming the relatively low dopant impurity concentration regions is carried out while controlling the conditions of ion implantation so that the relatively low dopant impurity concentration region on one side of said gate electrode has a lower dopant impurity concentration beneath said gate electrode than the relatively low dopant impurity concentration region on the other side of said gate electrode.

* * * * *